(12) United States Patent
Sakamoto et al.

(10) Patent No.: US 10,090,238 B2
(45) Date of Patent: Oct. 2, 2018

(54) WIRING SUBSTRATE AND METHOD FOR MANUFACTURING THE SAME

(71) Applicant: IBIDEN CO., LTD., Ogaki (JP)

(72) Inventors: Hajime Sakamoto, Ogaki (JP); Keisuke Shimizu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/451,520

(22) Filed: Mar. 7, 2017

(65) Prior Publication Data

US 2017/0256478 A1 Sep. 7, 2017

(30) Foreign Application Priority Data

Mar. 7, 2016 (JP) ................. 2016-043015

(51) Int. Cl.
| | | |
|---|---|---|
| *H01L 23/522* | (2006.01) | |
| *H01L 23/48* | (2006.01) | |
| *H01L 23/00* | (2006.01) | |
| *H01L 23/498* | (2006.01) | |
| *H01L 21/48* | (2006.01) | |
| *H01L 21/56* | (2006.01) | |

(Continued)

(52) U.S. Cl.
CPC ........ *H01L 23/522* (2013.01); *H01L 21/4857* (2013.01); *H01L 21/568* (2013.01); *H01L 21/6835* (2013.01); *H01L 23/48* (2013.01); *H01L 23/485* (2013.01); *H01L 23/4827* (2013.01); *H01L 23/49811* (2013.01); *H01L 23/49822* (2013.01); *H01L 23/5389* (2013.01); *H01L 24/19* (2013.01); *H01L 24/76* (2013.01); *H01L 24/82* (2013.01); *H01L 23/562* (2013.01); *H01L 2221/68359* (2013.01); *H01L 2221/68372* (2013.01); *H01L 2224/19* (2013.01); *H01L 2224/73267* (2013.01); *H01L 2224/92244* (2013.01); *H01L 2924/18162* (2013.01)

(58) Field of Classification Search
CPC ......... H01L 24/76; H01L 24/82; H01L 23/48; H01L 23/485; H01L 23/49811; H01L 23/49822; H01L 23/522
See application file for complete search history.

(56) References Cited

U.S. PATENT DOCUMENTS

2013/0249075 A1* 9/2013 Tateiwa ................ H05K 1/185
 257/734
2015/0245473 A1* 8/2015 Shimizu ............... H05K 1/0298
 257/778

FOREIGN PATENT DOCUMENTS

JP 2006-059992 A 3/2006

* cited by examiner

*Primary Examiner* — Eduardo A Rodela
(74) *Attorney, Agent, or Firm* — Oblon, McClelland, Maier & Neustadt, L.L.P.

(57) ABSTRACT

A wiring substrate includes insulating layers including a first insulating layer and an outermost insulating layer such that the first insulating layer is positioned at one end of the insulating layers in a lamination direction and that the outermost insulating layer is positioned at the opposite end of the insulating layers in the lamination direction and includes a reinforcing material; conductive layers laminated on the insulating layers such that the conductive layers include an outermost conductive layer formed on the outermost insulating layer and including pads, and a semiconductor element accommodated in an accommodating portion of the first insulating layer. The insulating layers are formed such that the insulating layers do not contain a reinforcing material other than the outermost insulating layer.

20 Claims, 18 Drawing Sheets

(51) Int. Cl.
*H01L 23/482* (2006.01)
*H01L 23/485* (2006.01)
*H01L 23/538* (2006.01)
*H01L 21/683* (2006.01)

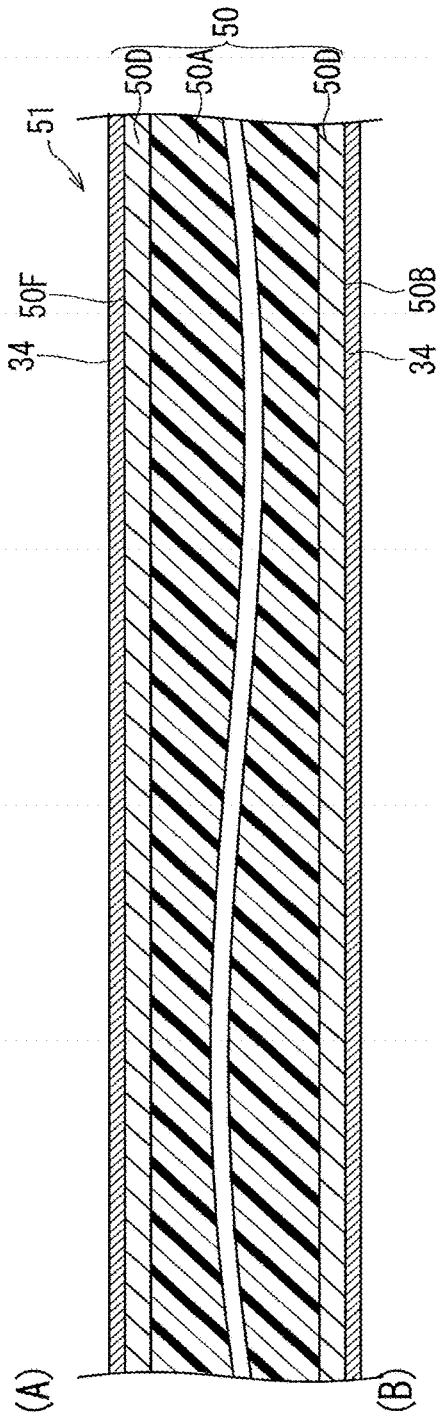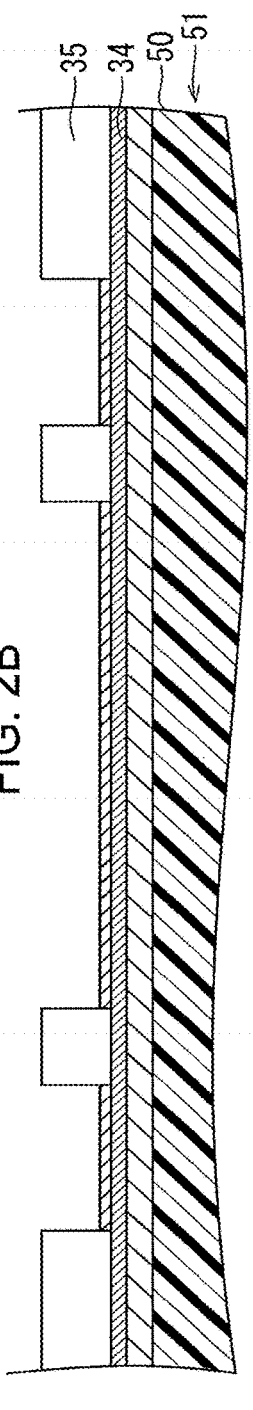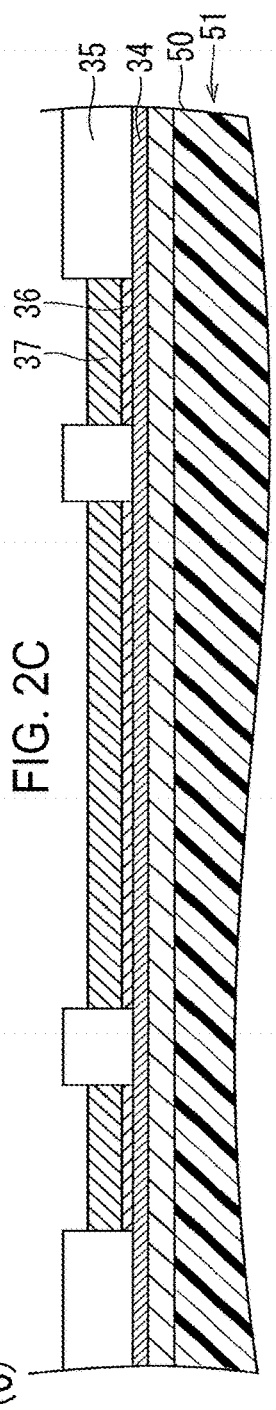

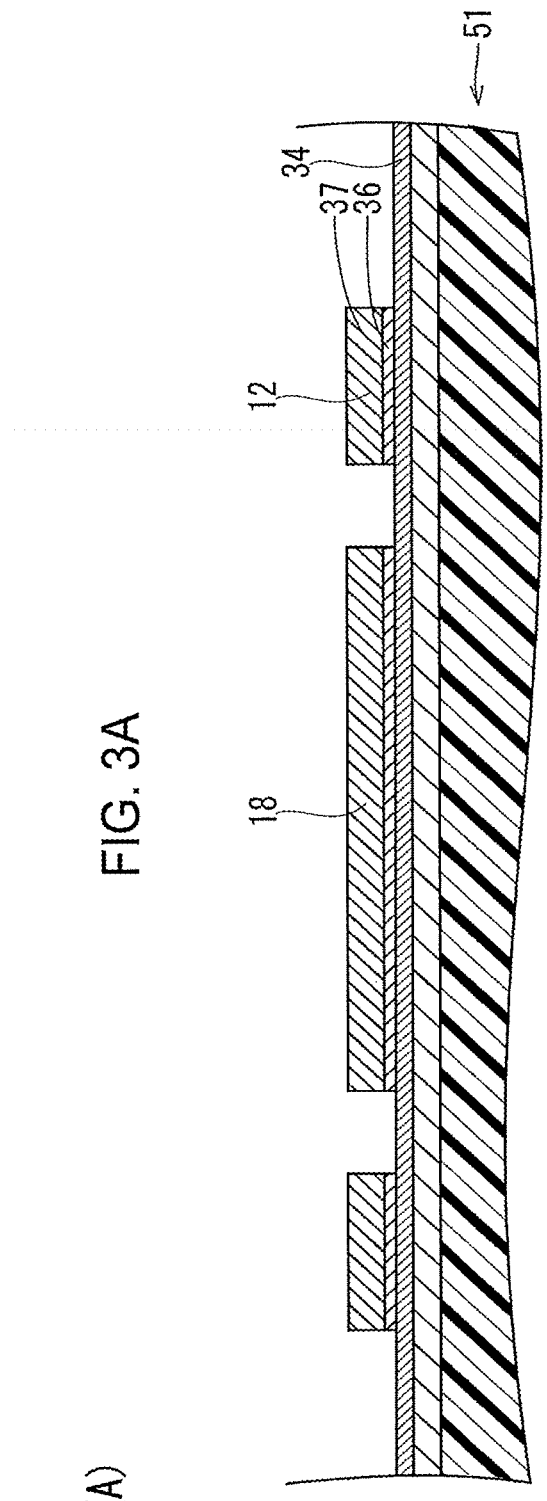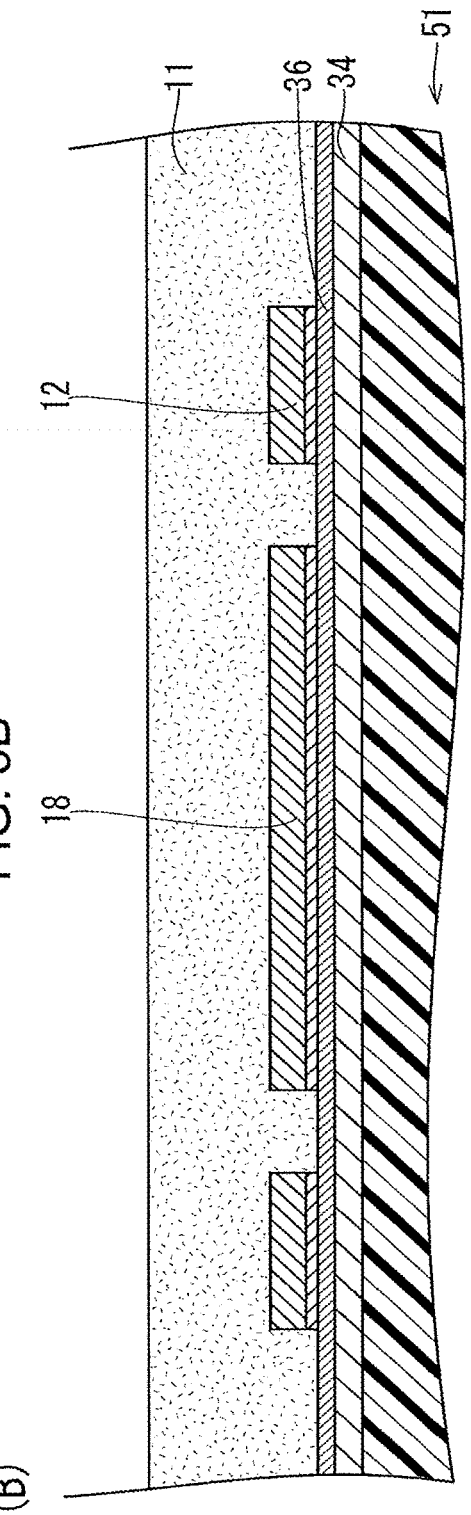

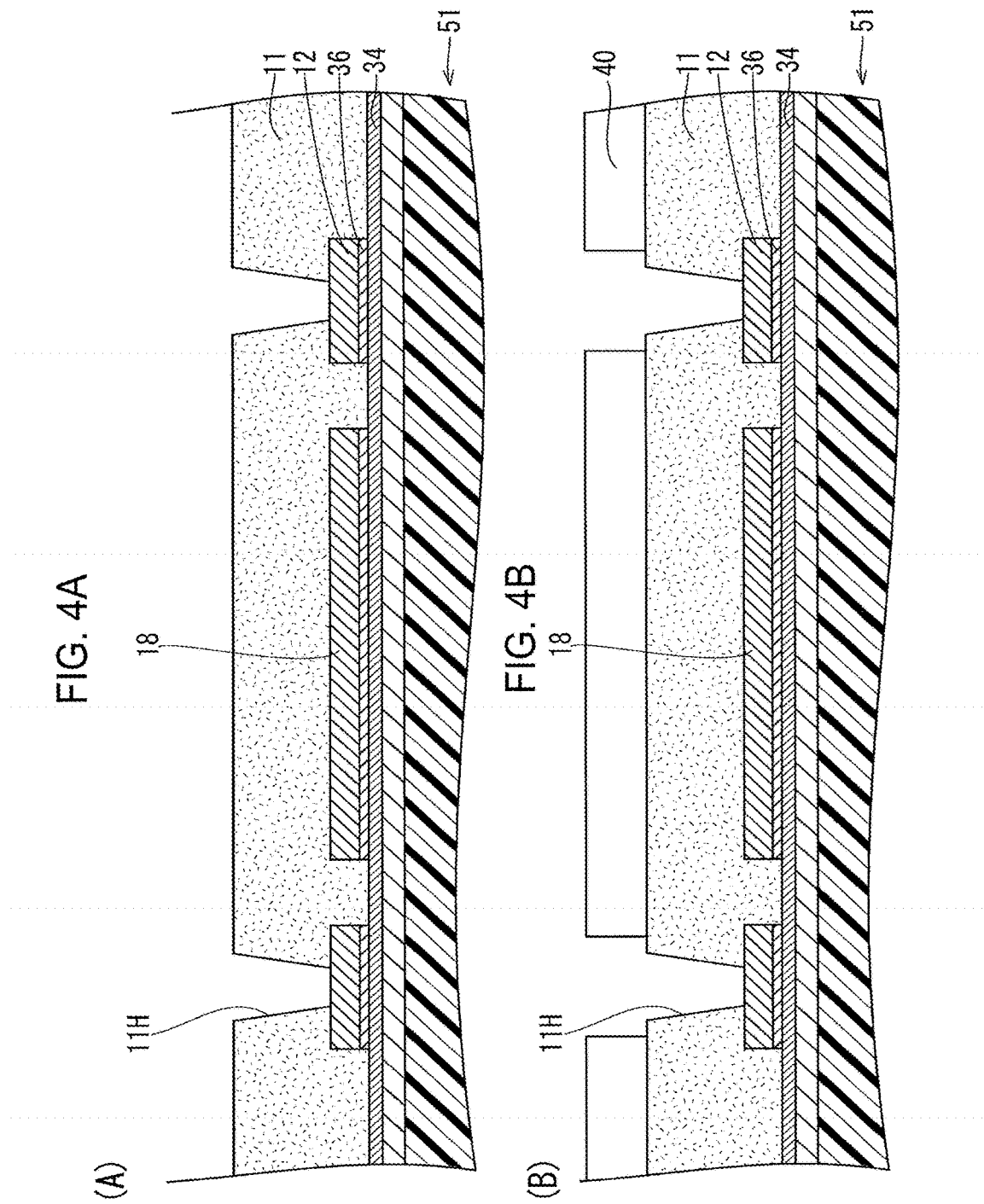

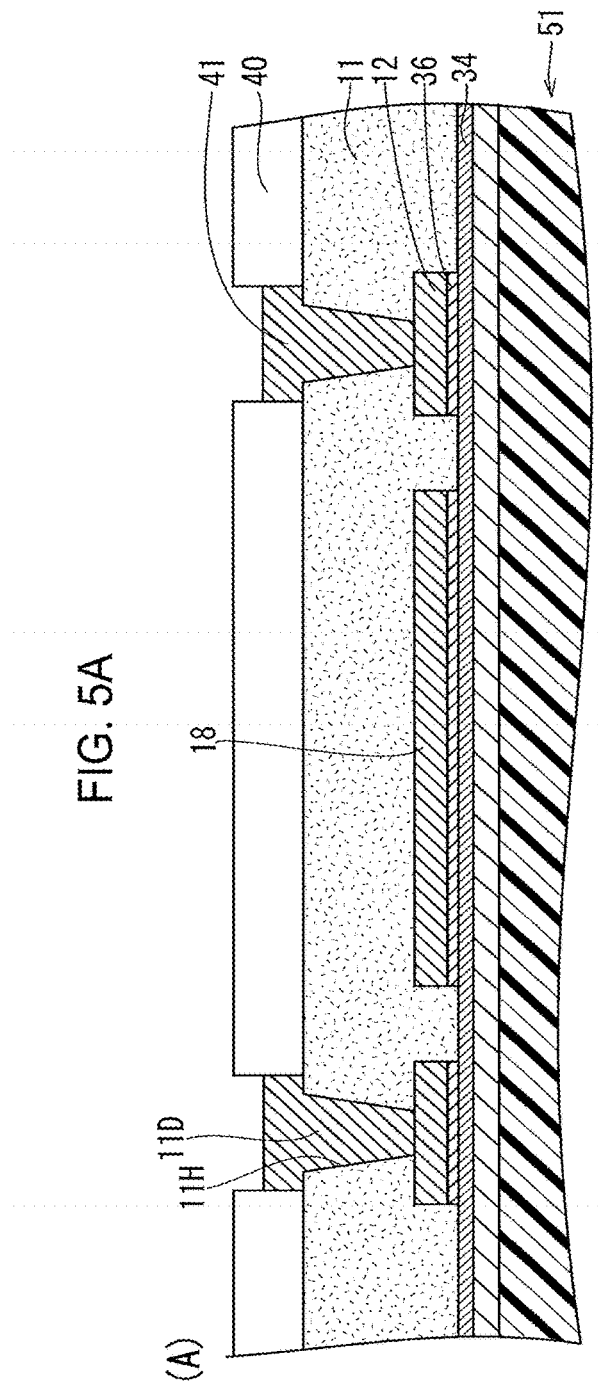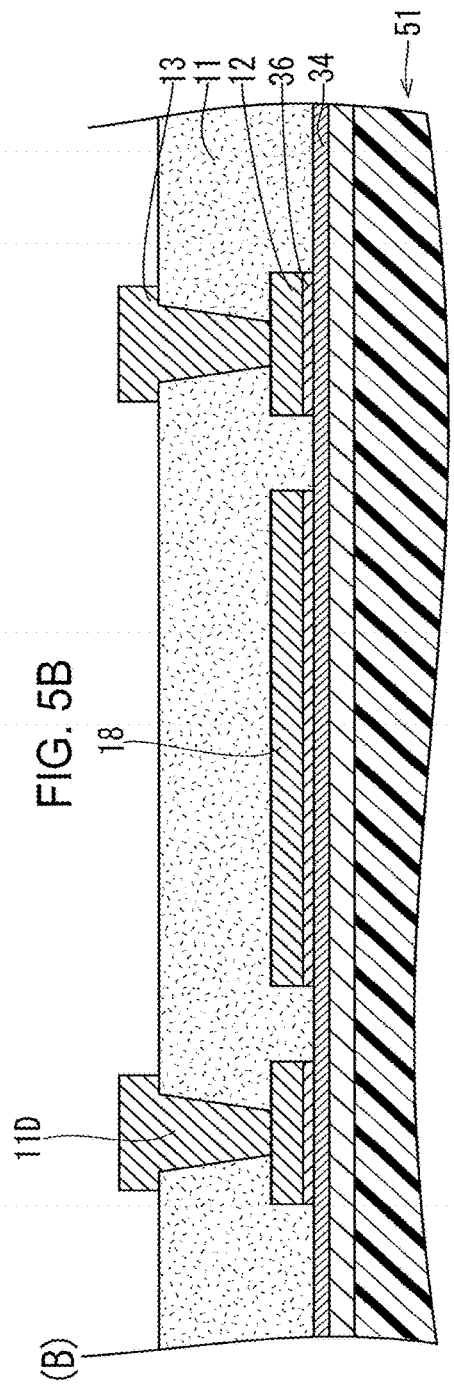

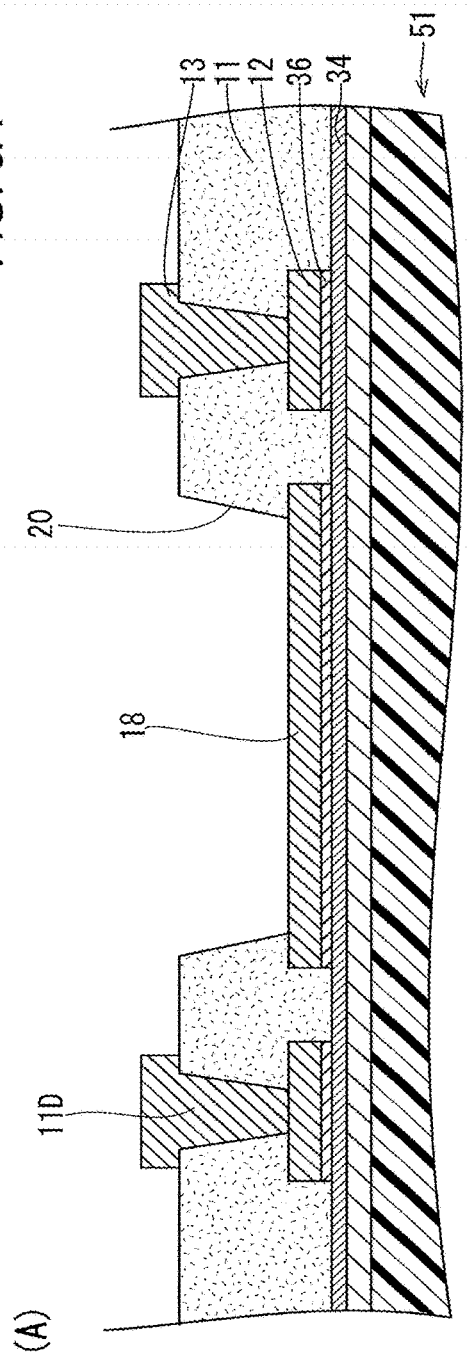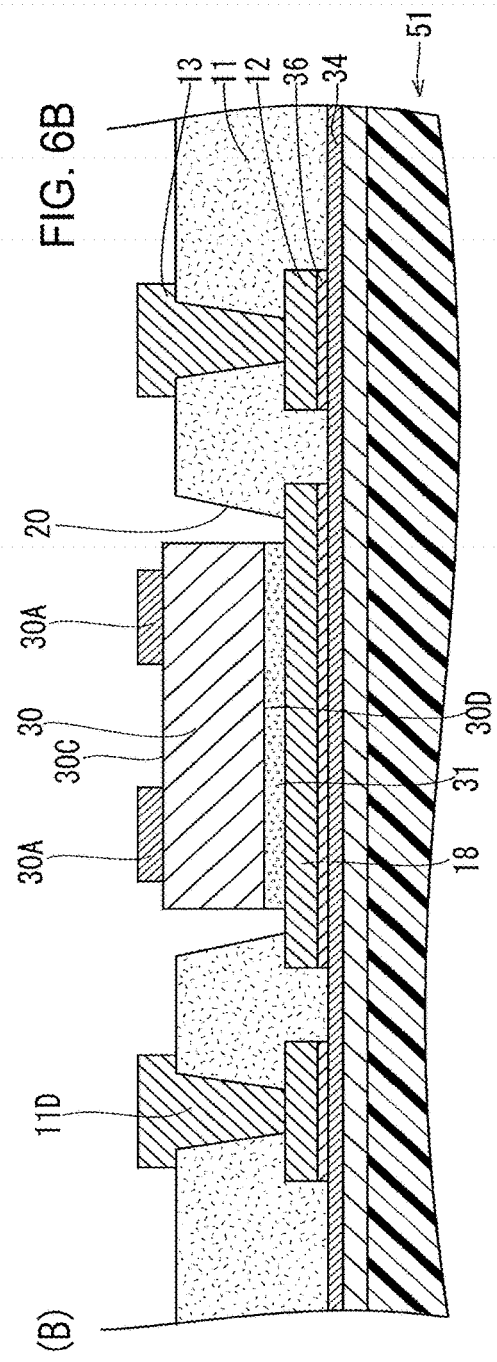

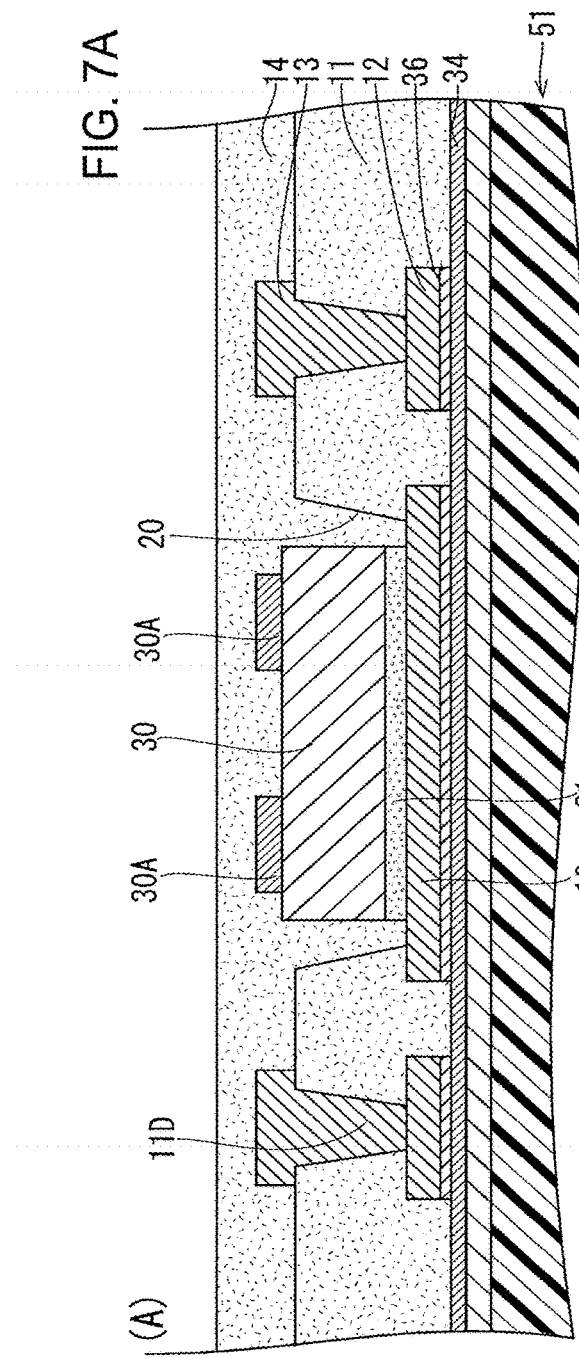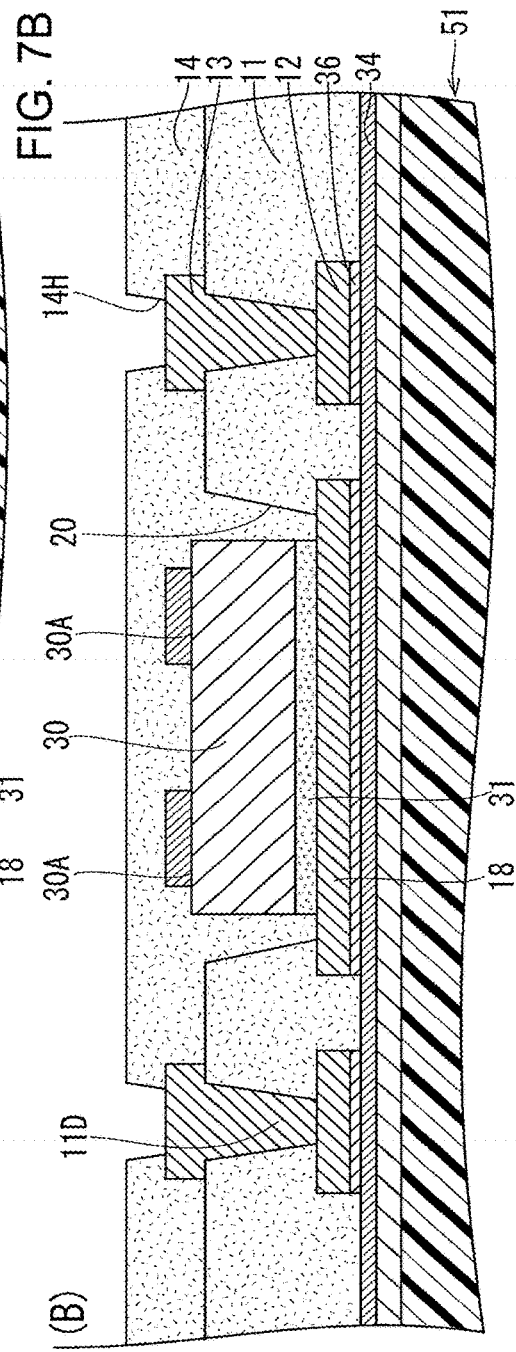

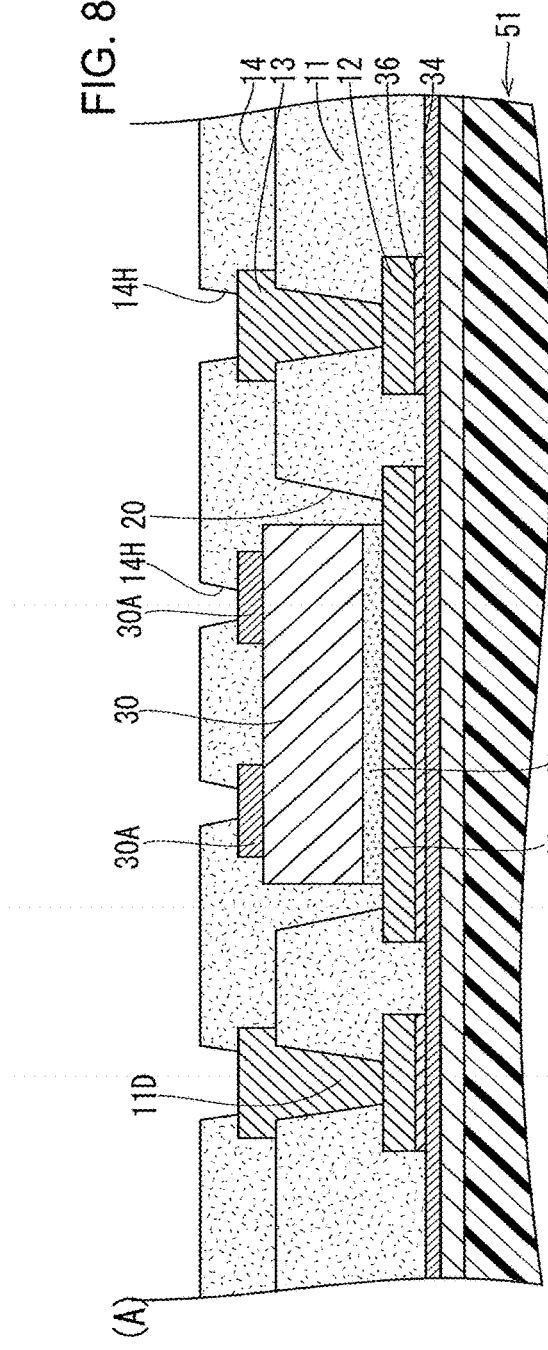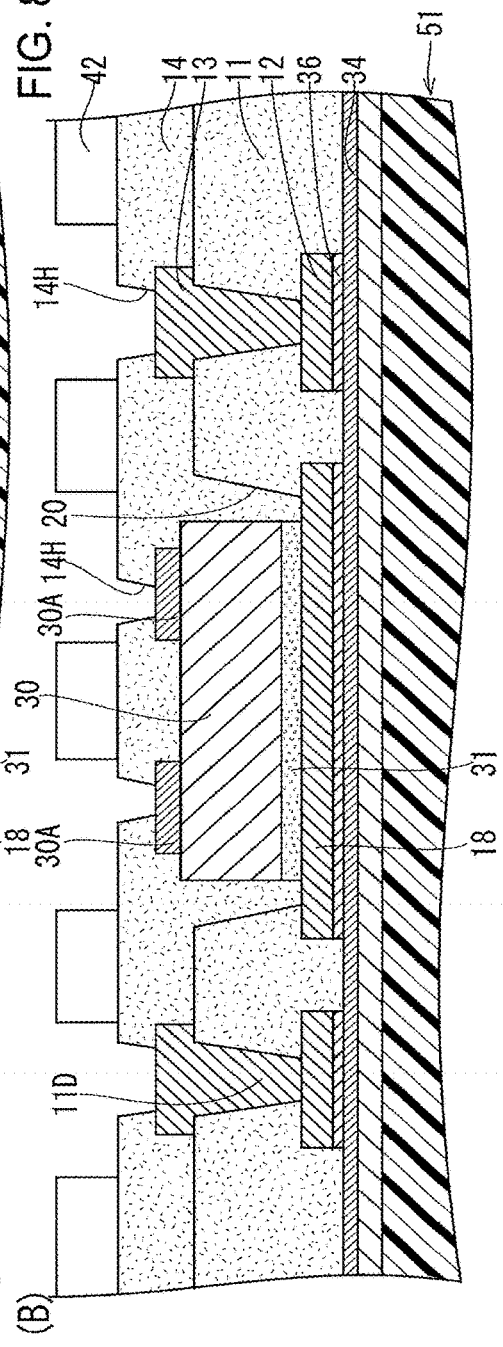

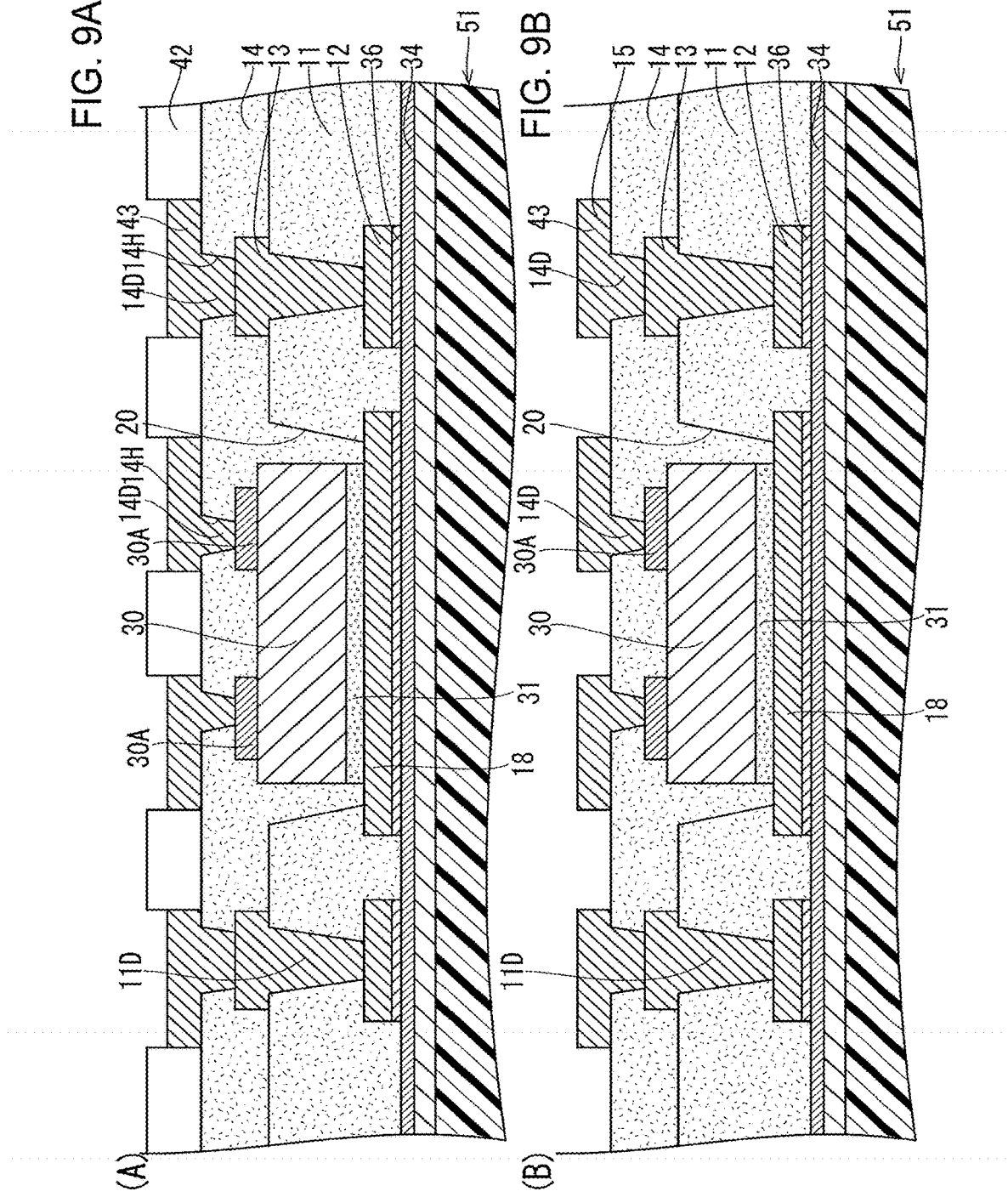

WIRING SUBSTRATE AND METHOD FOR MANUFACTURING THE SAME

CROSS-REFERENCE TO RELATED APPLICATIONS

The present application is based upon and claims the benefit of priority to Japanese Patent Application No. 2016-043015, filed Mar. 7, 2016, the entire contents of which are incorporated herein by reference.

BACKGROUND OF THE INVENTION

Field of the Invention

The present invention relates to a wiring substrate that is formed by laminating multiple conductive layers and multiple insulating layers, and relates to a method for manufacturing the wiring substrate.

Description of Background Art

Japanese Patent Laid-Open Publication No. 2006-059992 describes a wiring substrate in which a semiconductor element is embedded. The entire contents of this publication are incorporated herein by reference.

SUMMARY OF THE INVENTION

According to one aspect of the present invention, a wiring substrate includes insulating layers including a first insulating layer and an outermost insulating layer such that the first insulating layer is positioned at one end of the insulating layers in a lamination direction and that the outermost insulating layer is positioned at the opposite end of the insulating layers in the lamination direction and includes a reinforcing material; conductive layers laminated on the insulating layers such that the conductive layers include an outermost conductive layer formed on the outermost insulating layer and including pads, and a semiconductor element accommodated in an accommodating portion of the first insulating layer. The insulating layers are formed such that the insulating layers do not contain a reinforcing material other than the outermost insulating layer.

According to another aspect of the present invention, a method for manufacturing a wiring substrate includes forming, on a support member, insulating layers including a first insulating layer and an outermost insulating layer such that the first insulating layer is positioned at one end of the insulating layers in a lamination direction and that the outermost insulating layer is positioned at the opposite end of the insulating layers in the lamination direction and includes a reinforcing material, and conductive layers laminated on the insulating layers such that the conductive layers includes an outermost conductive layer formed on the outermost insulating layer and including pads, and removing the support member from the insulating and conductive layers. The forming of the insulation and conductive layers includes forming the first conductive layer on the support member, forming the accommodating portion in the first insulating layer such that the accommodating portion penetrates through the first insulating layer, accommodating a semiconductor element in the accommodating portion of the first insulating layer such that the semiconductor element is positioned in the accommodating portion of the first insulating layer, forming the outermost insulating layer at the opposite end of the insulating layers in the lamination direction, and forming the outermost conductive layer on the outermost insulating layer such that the outermost conductive layer includes the pads, the removing of the support member includes removing the support member from the first insulating layer such that the semiconductor element is accommodated in the accommodating portion of the first insulating layer before the support member is removed from the first insulating layer, and the insulating layers is formed such that the insulating layers do not contain a reinforcing material other than the outer' lost insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A-2C are cross-sectional side views illustrating manufacturing processes of the wiring substrate;

FIGS. 3A and 3B are cross-sectional side views illustrating manufacturing processes of the wiring substrate;

FIGS. 4A and 4B are cross-sectional side views illustrating manufacturing processes of the wiring substrate;

FIGS. 5A and 5B are cross-sectional side views illustrating manufacturing processes of the wiring substrate;

FIGS. 6A and 6B are cross-sectional side views illustrating manufacturing processes of the wiring substrate;

FIGS. 7A and 7B are cross-sectional side views illustrating manufacturing processes of the wiring substrate;

FIGS. 8A and 8B are cross-sectional side views illustrating manufacturing processes of the wiring substrate;

FIGS. 9A and 9B are cross-sectional side views illustrating manufacturing processes of the wiring substrate;

DETAILED DESCRIPTION OF THE EMBODIMENTS

Figure 1:
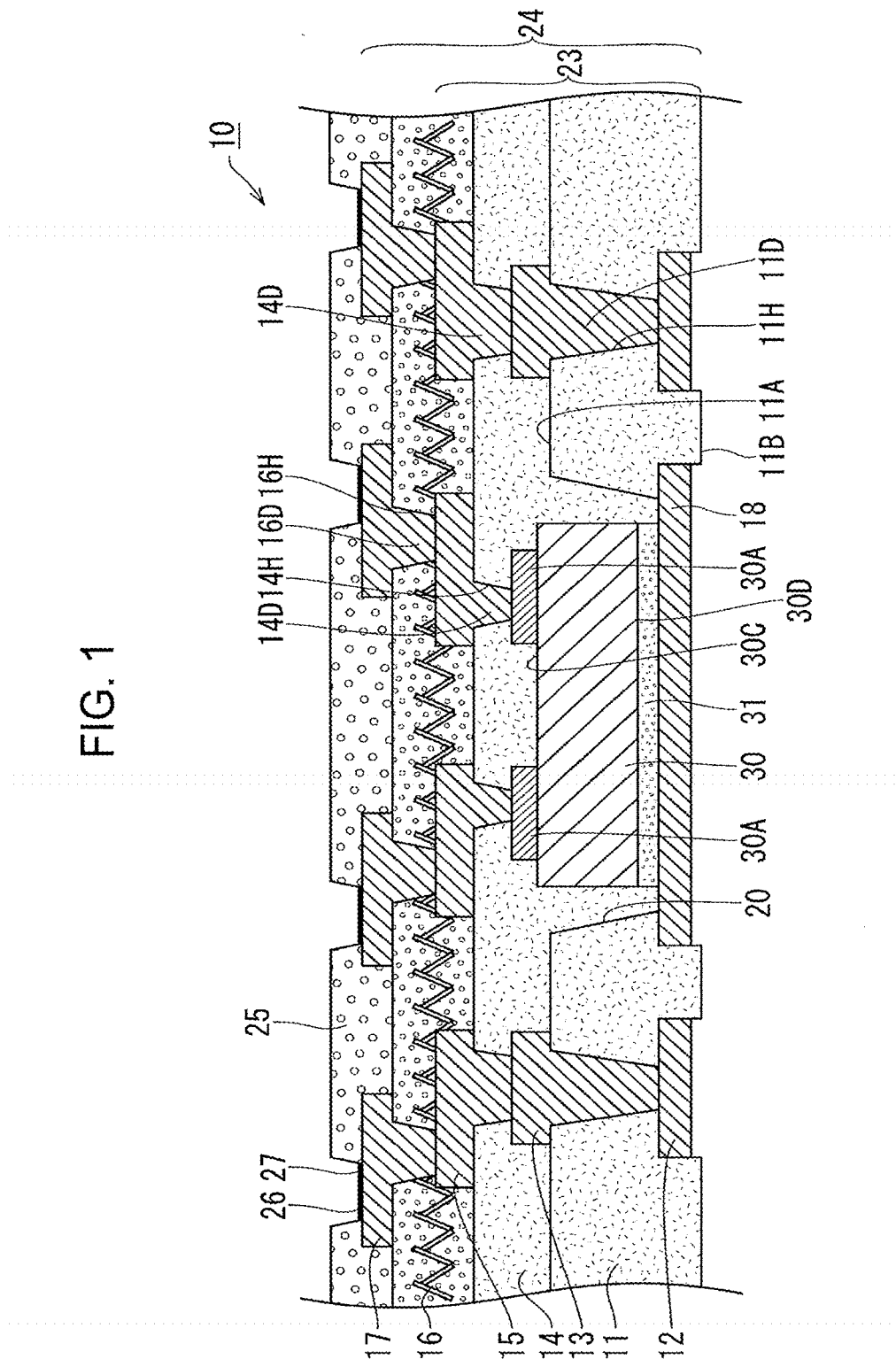
FIG. 1 is a cross-sectional side view of a wiring substrate according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described with reference to FIG. 1-16. As illustrated in FIG. 1, a wiring substrate 10 of the present embodiment has a build-up layer 24 obtained by alternately laminating multiple insulating resin layers (11, 14, 16) (corresponding to "insulating layers" according to an embodiment of the present invention) and multiple conductive layers (12, 13, 15, 17) that each include conductive paths.

Among the multiple insulating resin layers (11, 14, 16) of the build-up layer 24, the first insulating resin layer 11 according to an embodiment of the present invention is formed at one end in a lamination direction. The second conductive layer 13 is laminated on a primary surface (11A) of the first insulating resin layer 11, the primary surface (11A) being a surface on an opposite side of the one end in the lamination direction. On the other hand, the first conductive layer 12 is formed on a secondary surface (11B) side of the first insulating resin layer 11, the secondary surface (11B) being on an opposite side of the primary surface (11A). The first conductive layer 12 is embedded on the secondary surface (11B) side of the first insulating resin layer 11 and is partially exposed on the secondary surface (11B). Further, a surface of the first conductive layer 12 on the secondary surface (11B) side of the first insulating resin layer 11 is positioned on an inner side of the secondary surface (11B) of the first insulating resin layer 11. In the present embodiment, a direction from the secondary surface (11B) toward the primary surface (11A) of the first insulating resin layer 11 is defined as "upward." Further, the first insulating resin layer 11 is thicker than the later-described second and third insulating resin layers (14, 16).

Further, via holes (11H) and a cavity 20 (corresponding to an "accommodating part" according to an embodiment of the present invention) are formed in the first insulating resin layer 11. The via holes (11H) each have a tapered shape that is gradually reduced in diameter from the primary surface (11A) side toward the secondary surface (11B) side. The via holes (11H) are filled with plating and via conductors (11D) are formed. Then, due to the via conductors (11D) of the first insulating resin layer 11, the first conductive layer 12 and the second conductive layer 13 are connected to each other.

The cavity 20 has a truncated pyramid-shaped space that is gradually reduced in diameter from the primary surface (11A) side toward the secondary surface (11B), and penetrates the first insulating resin layer 11. Further, a portion of the first conductive layer 12 below the cavity 20 is a plane portion 18. An upper surface of the plane portion 18 is exposed as a bottom surface in the cavity 20.

A semiconductor element 30 is accommodated in the cavity 20. The semiconductor element 30 has an active surface (30C) on the primary surface (11A) side of the first insulating resin layer 11 and a non-active surface (30D) on the secondary surface (11B) side of the first insulating resin layer 11, terminals (30A, 30A) being provided on the active surface (30C) and no terminal being provided on the non-active surface (30D). The non-active surface (30D) is bonded to the plane portion 18 by an adhesive 31. Further, the semiconductor element 30 slightly protrudes from the cavity 20, and upper surfaces of the terminals (30A, 30A) are substantially flush with an upper surface of the second conductive layer 13.

The second insulating resin layer 14 covering the second conductive layer 13 is laminated on the primary surface (11A) of the first insulating resin layer 11. A portion of the second insulating resin layer 14 enters a gap between the semiconductor element 30 and an inner side surface of the cavity 20, and covers the semiconductor element 30. Further, the third conductive layer 15 is formed on an upper surface of the second insulating resin layer 14.

The third insulating resin layer 16, which is formed on an end on an opposite side of the first insulating resin layer 11 among the multiple insulating resin layers (11, 14, 16) and corresponds to an "outermost insulating layer" according to an embodiment of the present invention, is laminated on the second insulating resin layer 14. The fourth conductive layer 17 (corresponding to an "outermost conductive layer" according to an embodiment of the present invention) is formed on the third insulating resin layer 16. A solder resist layer 25 is laminated on the fourth conductive layer 17. Multiple pad holes are formed in the solder resist layer 25. Portions of the fourth conductive layer 17 that are respectively exposed from the pad holes become pads 26. A metal film 27 including a nickel layer, a palladium layer and a gold layer is formed on each of the pads 26.

Further, multiple via holes (14H, 16H) are formed in the second and third insulating layers (14, 16). The via holes (14H, 16H) are filled with plating and multiple via conductors (14D, 16D) are formed. Then, due to the via conductors (14D) of the second insulating resin layer 14, the second conductive layer 13 and the third conductive layer 15 are connected to each other and the terminals (30A, 30A) of the semiconductor element 30 and the third conductive layer 15 are connected to each other; and, due to the via conductors (16D) of the third insulating resin layer 16, the third conductive layer 15 and the fourth conductive layer 17 are connected to each other.

The insulating resin layers (11, 14, 16) are all each formed from a resin sheet of a B-stage (for example, a prepreg, an insulating film for a build-up substrate, and the like). Here, in the wiring substrate 10 of the present embodiment, among the multiple insulating resin layers (11, 14, 16), the third insulating resin layer 16 contains a fibrous or cloth-like reinforcing material 19 such as a glass cloth (see FIG. 16), whereas the first and second insulating resin layer (11, 14) do not contain a fibrous or cloth-like reinforcing material. Hereinafter, the fibrous or cloth-like reinforcing material is simply referred to as a "reinforcing material."

Next, a method for manufacturing the wiring substrate 10 of the present embodiment is described.

(1) As illustrated in FIG. 2A, a support member 51 is prepared in which copper carriers (34, 34) (corresponding to "metal films" provided in a "support member" according to an embodiment of the present invention) are respectively laminated on an F surface (50F), which is a front side surface of a support substrate 50, and a B surface (50B), which is a back side surface of the support substrate 50. The support substrate 50 is formed by laminating a copper foil (50B) on both front side and back side surfaces of a resin layer (50A). The copper foil (50B) of the support substrate 50 and the carrier 34 are bonded to each other at their peripheral portions.

Since the same processing is performed on the carrier 34 on the F surface (50F) side of the support substrate 50 and on the carrier 34 on the B surface (50B) side of the support substrate 50, hereinafter, processing performed on the carrier 34 on the F surface (50F) side is described as an example.

(2) As illustrated in FIG. 2B, a plating resist 35 of a predetermined pattern is formed on the carrier 34 of the support member 51.

(3) As illustrated in FIG. 2C, a Ni electrolytic plating treatment is performed and a Ni plating layer 36 is formed on a portion of the carrier 34 exposed from the plating resist 35. Further, a Cu electrolytic plating treatment is performed and a copper plating layer 37 is formed on the Ni plating layer 36.

(4) The plating resist 35 is peeled off. As illustrated in FIG. 3A, the first conductive layer 12 including the conductive paths and the plane portion 18 is formed by the remaining copper plating layer 37.

(5) As illustrated in FIG. 3B, as the first insulating resin layer 11, a resin sheet that does not contain a reinforcing material is laminated on the first conductive layer 12 and is hot pressed.

(6) As illustrated in FIG. 4A, CO2 laser is irradiated to the first insulating resin layer 11, and the via holes (11H) are formed. The via holes (11H) are formed on the conductive paths of the first conductive layer 12.

(7) An electroless plating treatment is performed. An electroless plating film (not illustrated in the drawings) is formed on the first insulating resin layer 11 and in the via holes (11H).

(8) As illustrated in FIG. 4B, a plating resist 40 of a predetermined pattern is formed on the electroless plating film.

(9) An electrolytic plating treatment is performed. As illustrated in FIG. 5A, the via holes (11H) are filled with plating and the via conductors (11D) are formed. Further, an electrolytic plating film 41 is formed on a portion of the electroless plating film (not illustrated in the drawings) on the first insulating resin layer 11, the portion being exposed from the plating resist 40.

(10) The plating resist 40 is removed, and the electroless plating film (not illustrated in the drawings) under the plating resist 40 is removed. As illustrated in FIG. 5B, the second conductive layer 13 is formed on the first insulating resin layer 11 by the remaining electrolytic plating film 41 and electroless plating film. Then, the first conductive layer 12 and the second conductive layer 13 are connected to each other by the via conductors (11D).

(11) As illustrated in FIG. 6A, the cavity 20 is formed on the plane portion 18 of the first insulating resin layer 11 using CO2 laser.

(12) As illustrated in FIG. 6B, the adhesive 31 is injected into the cavity 20. Thereafter, the semiconductor element 30 is accommodated in the cavity 20 by a mounter (not illustrated in the drawings). In this case, the semiconductor element 30 is positioned such that the terminals (30A, 30A) face upward.

(13) As illustrated in FIG. 7A, as the second insulating resin layer 14, a resin sheet without a reinforcing material is laminated on the first insulating resin layer 11 from above the second conductive layer 13, and is hot pressed. In this case, the resin sheet is filled in between portions of the second conductive layer 13, and a thermosetting resin exuded from the resin sheet is filled in a gap between the inner surface of the cavity 20 and the semiconductor element 30.

(14) As illustrated in FIG. 7B, CO2 laser is irradiated to the second conductive layer 13 of the second insulating resin layer 14, and the multiple via holes (14H) are formed.

(15) As illustrated in FIG. 8A, UV laser is irradiated to the terminals (30A) of the semiconductor element 30 in the second insulating resin layer 14, and the via holes (14H) are formed each having a smaller diameter than that of each of the via holes (14H) on the second conductive layer 13.

(16) An electroless plating treatment is performed. An electroless plating film (not illustrated in the drawings) is formed on the second insulating resin layer 14 and in the via holes (14H).

(17) As illustrated in FIG. 8B, a plating resist 42 of a predetermined pattern is formed on the electroless plating film on the second insulating resin layer 14.

(18) An electrolytic plating treatment is performed. As illustrated in FIG. 9A, the via holes (14H) are filled with plating and the via conductors (14D) are formed. Further, an electrolytic plating film 43 is formed on a portion of the electroless plating film (not illustrated in the drawings) on the second insulating resin layer 14, the portion being exposed from the plating resist 42.

(19) The plating resist 42 is removed, and the electroless plating film (not illustrated in the drawings) under the plating resist 42 is removed. As illustrated in FIG. 9B, the third conductive layer 15 is formed on the second insulating resin layer 14 by the remaining electrolytic plating film 43 and electroless plating film. Then, a state is achieved in which a portion of the third conductive layer 15 and the second conductive layer 13 are connected to each other by the via conductors (14D), and the other portion of the third conductive layer 15 and the semiconductor element 30 are connected to each other by the via conductors (14D).

Figure 10:
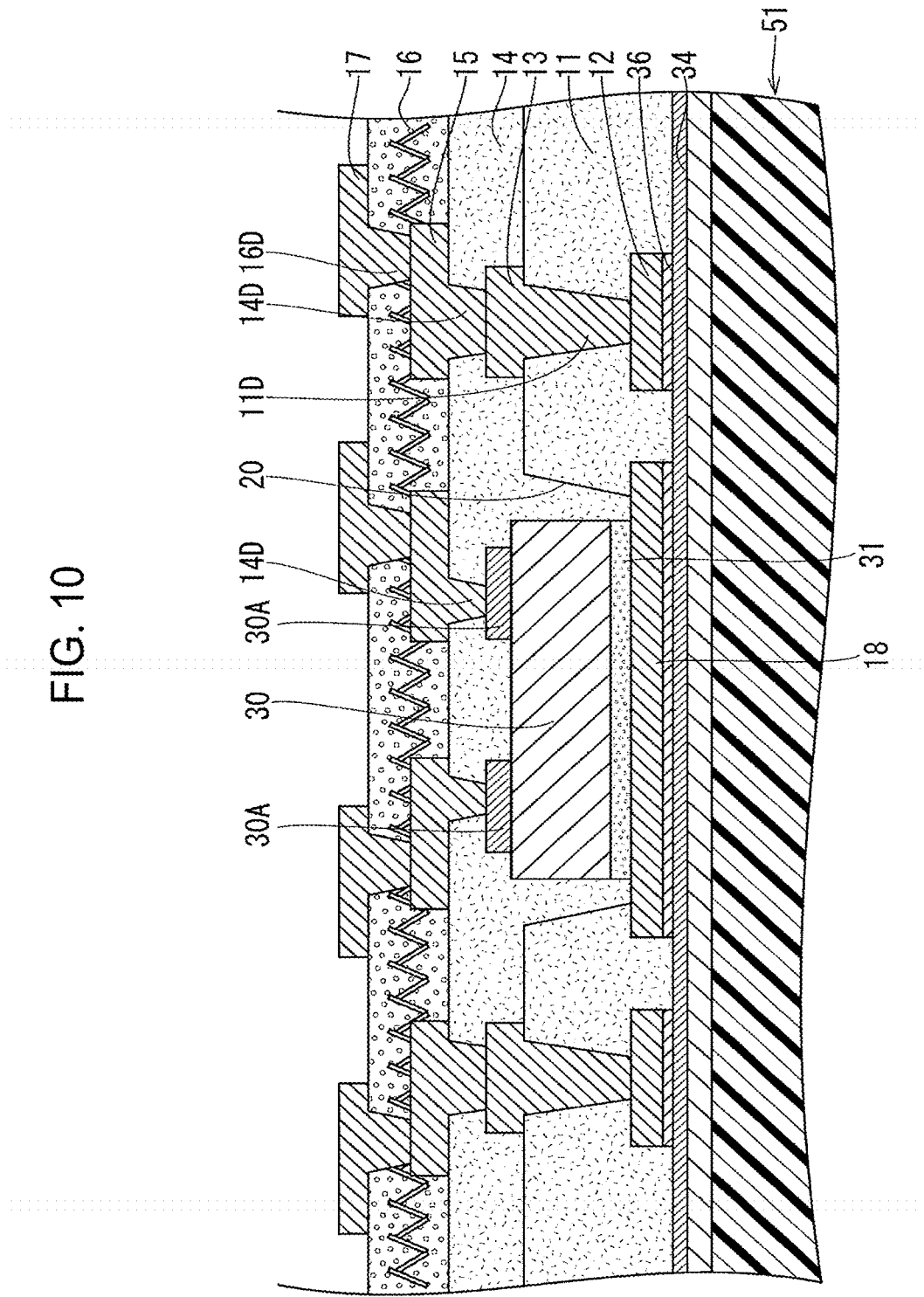
FIG. 10 is a cross-sectional side view illustrating a manufacturing process of the wiring substrate.

(20) As the third insulating resin layer 16, a resin sheet containing a reinforcing material 19 (see FIG. 16) is laminated on the second insulating resin layer 14 from above the third conductive layer 15 and is hot pressed. Thereafter, by performing processes same as the above-described processes (14)-(19), as illustrated in FIG. 10, a state is achieved in which the third insulating resin layer 16, which contains the reinforcing material 19, and the fourth conductive layer 17 are formed on the third conductive layer 15, and the fourth conductive layer 17 and the third conductive layer 15 are connected to each other by the via conductors (16D).

Figure 11:
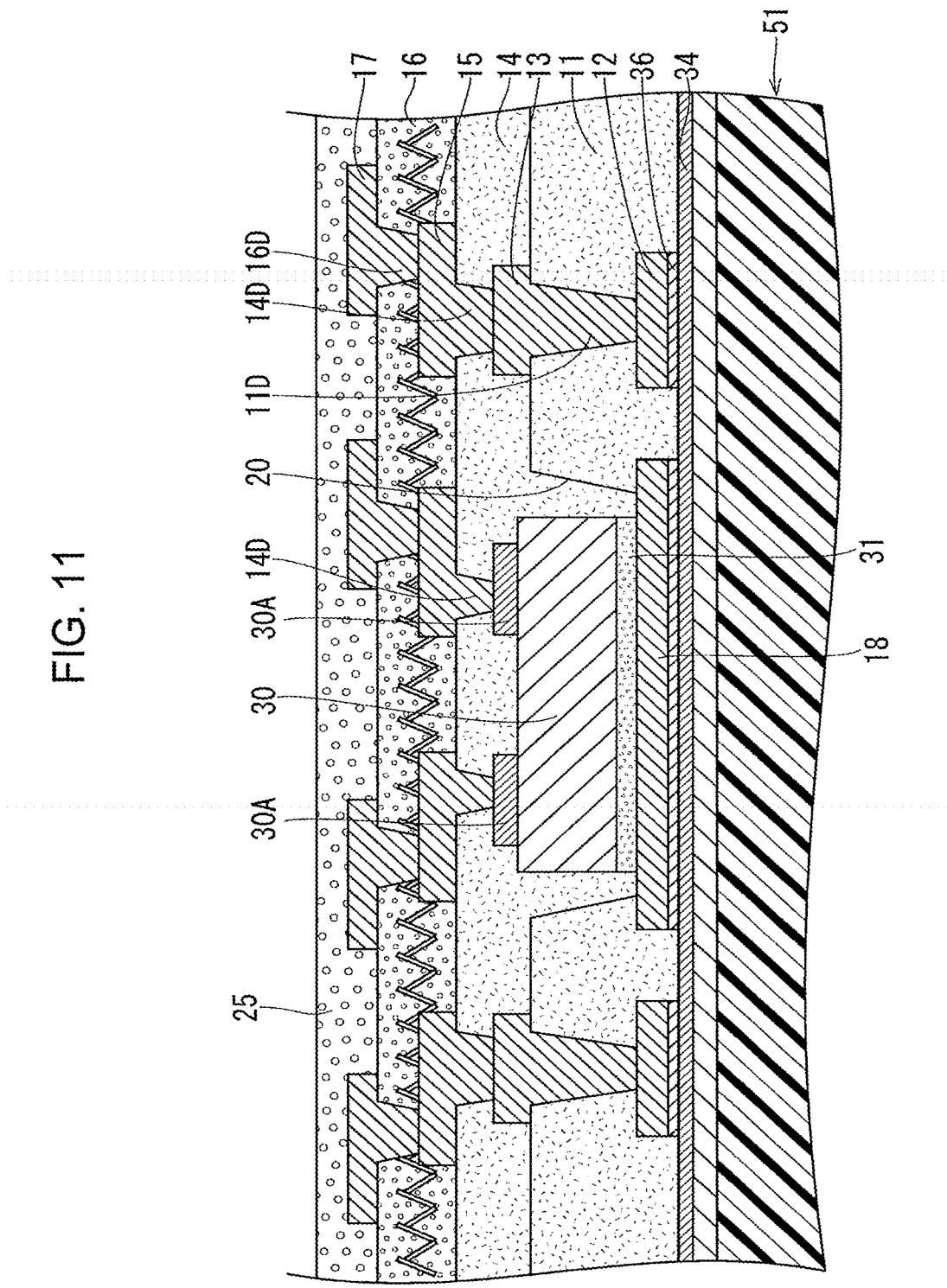
FIG. 11 is a cross-sectional side view illustrating a manufacturing process of the wiring substrate.

(21) As illustrated in FIG. 11, the solder resist layer 25 is laminated on the fourth conductive layer 17.

Figure 12:
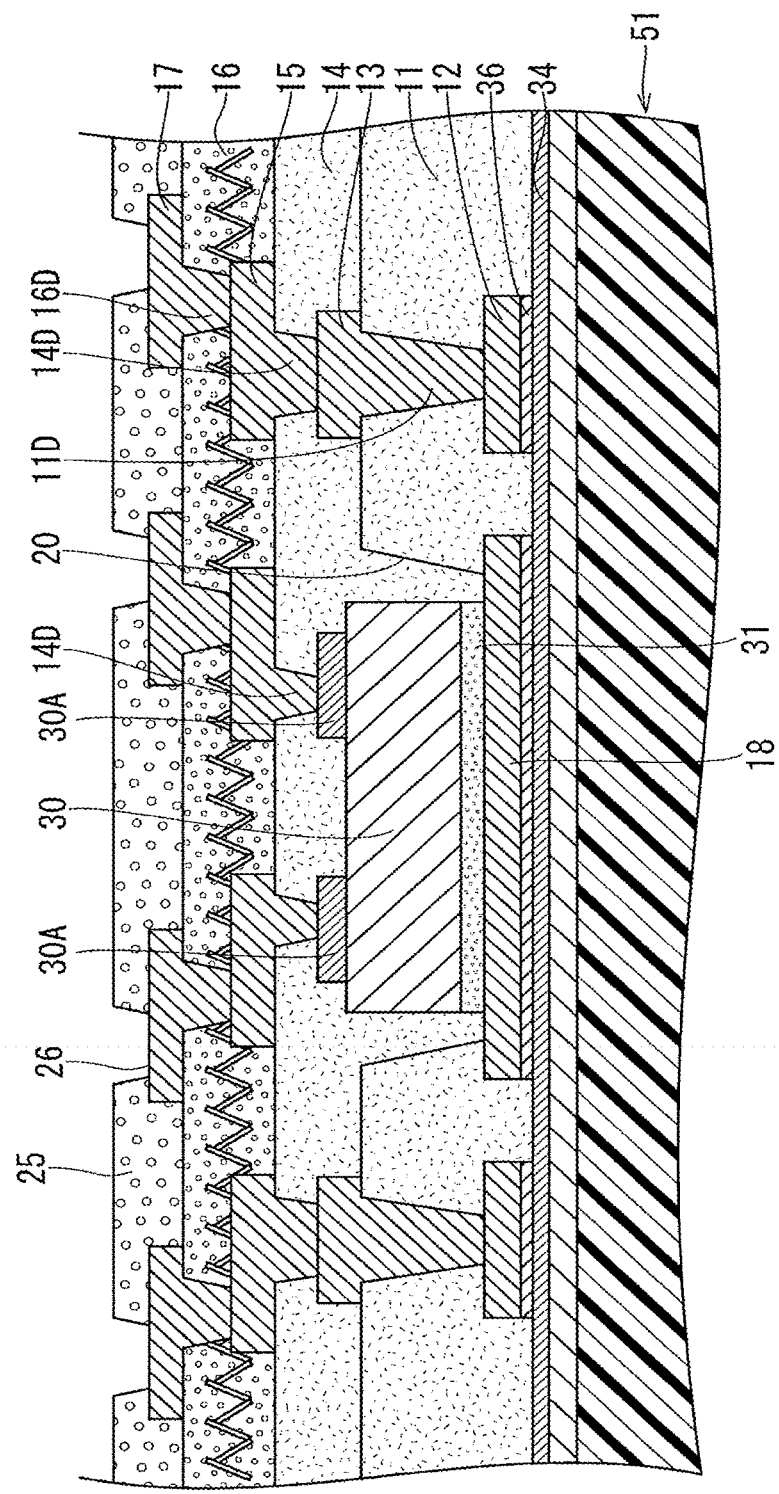
FIG. 12 is a cross-sectional side view illustrating a manufacturing process of the wiring substrate.

(22) As illustrated in FIG. 12, tapered pad holes are formed at predetermined places in the solder resist layer 25, and portions of the fourth conductive layer 17 exposed from the pad holes become the pads 26.

Figure 13:
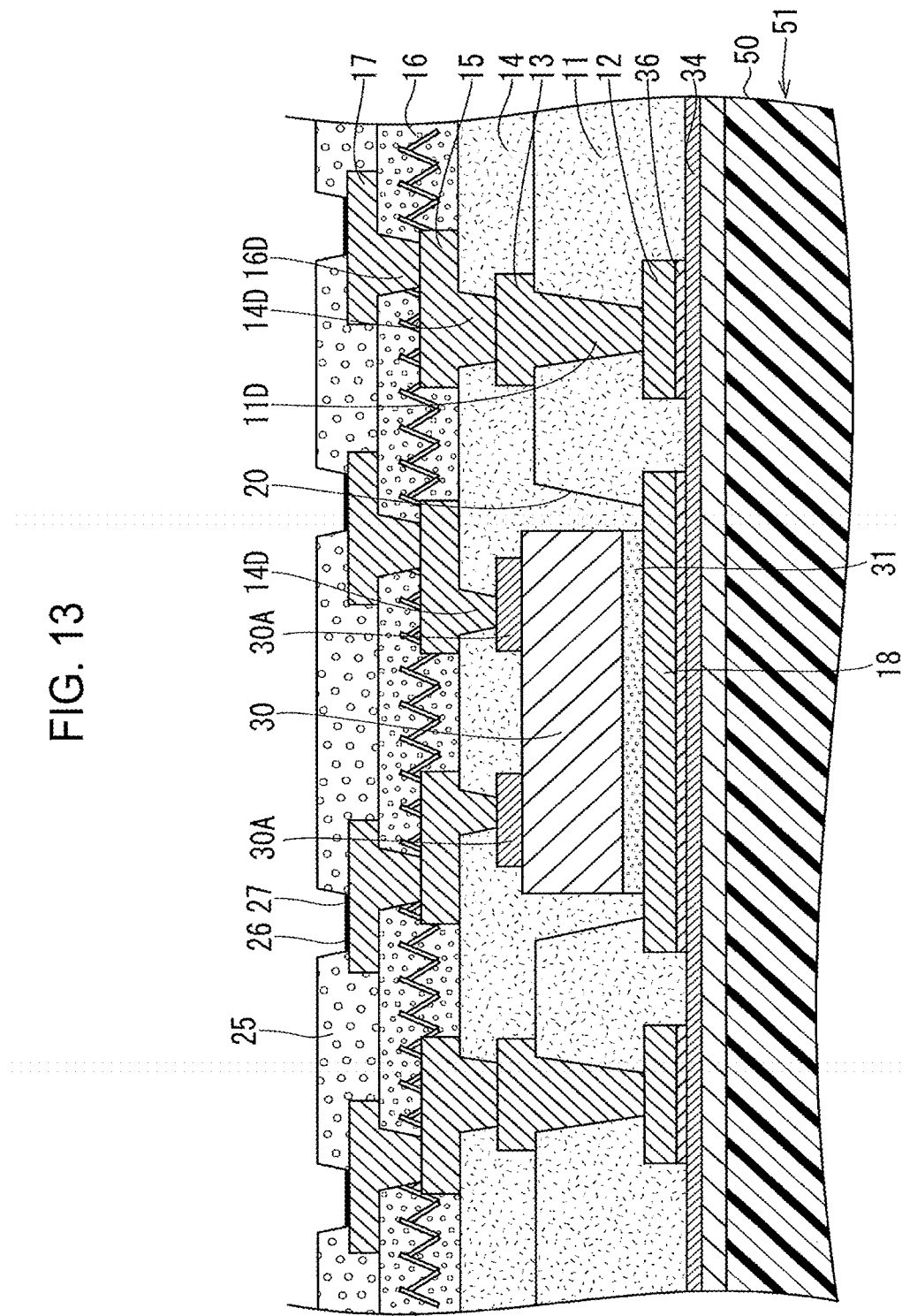
FIG. 13 is a cross-sectional side view illustrating a manufacturing process of the wiring substrate.

(23) On each of the pads 26, a nickel layer, a palladium layer and a gold layer are laminated in this order and a metal film 27 illustrated in FIG. 13 is formed. Instead of the metal film 27, it is also possible to perform a surface treatment using OSP (preflux).

Figure 14:
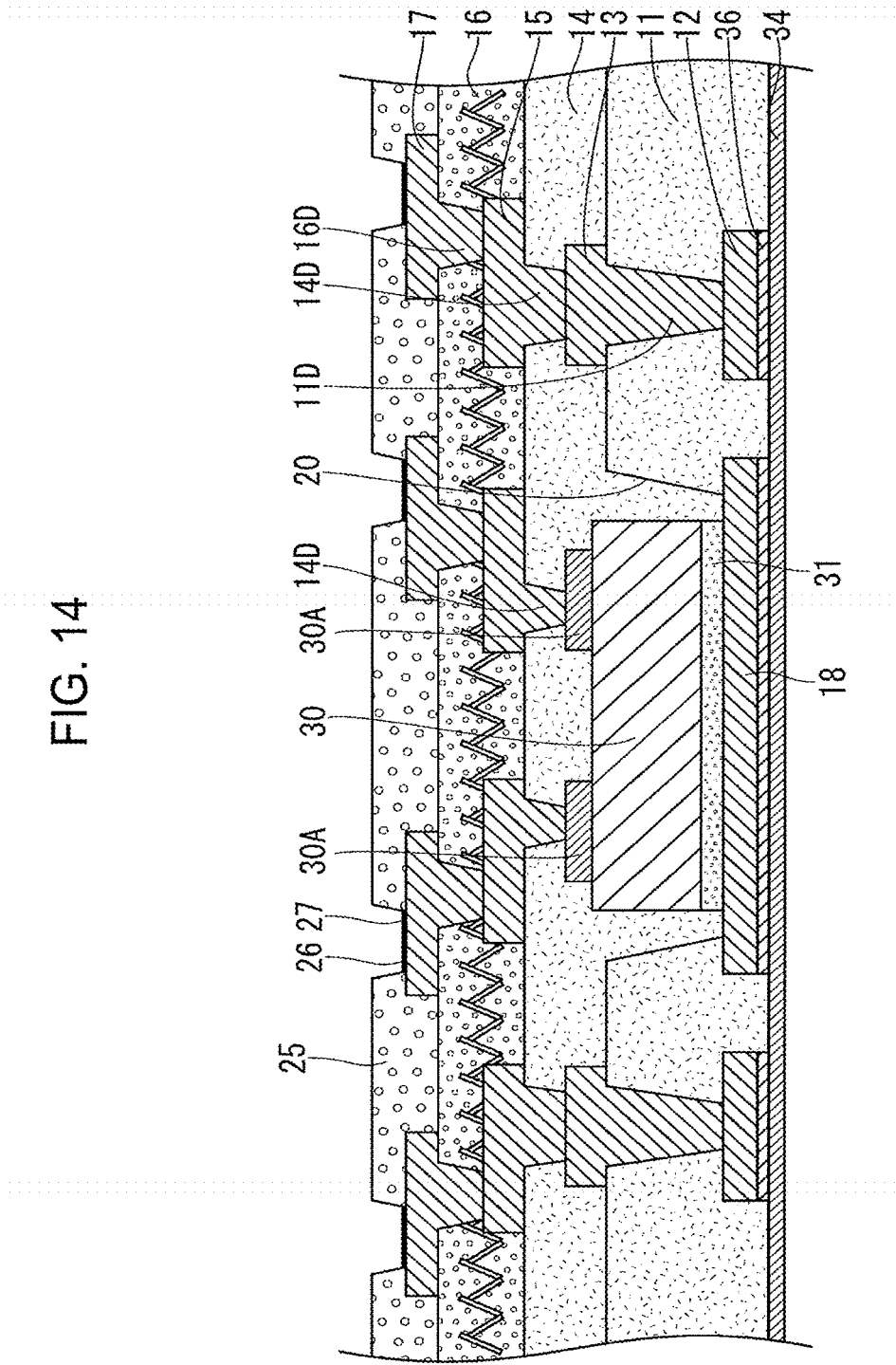
FIG. 14 is a cross-sectional side view illustrating a manufacturing process of the wiring substrate.

(24) As illustrated in FIG. 14, the resulting substrate is peeled off from the support substrate 50.

(25) The carrier 34 and the Ni plating layer 36 are respectively removed by etching. As a result, the wiring substrate 10 illustrated in FIG. 1 is completed.

Figure 15:
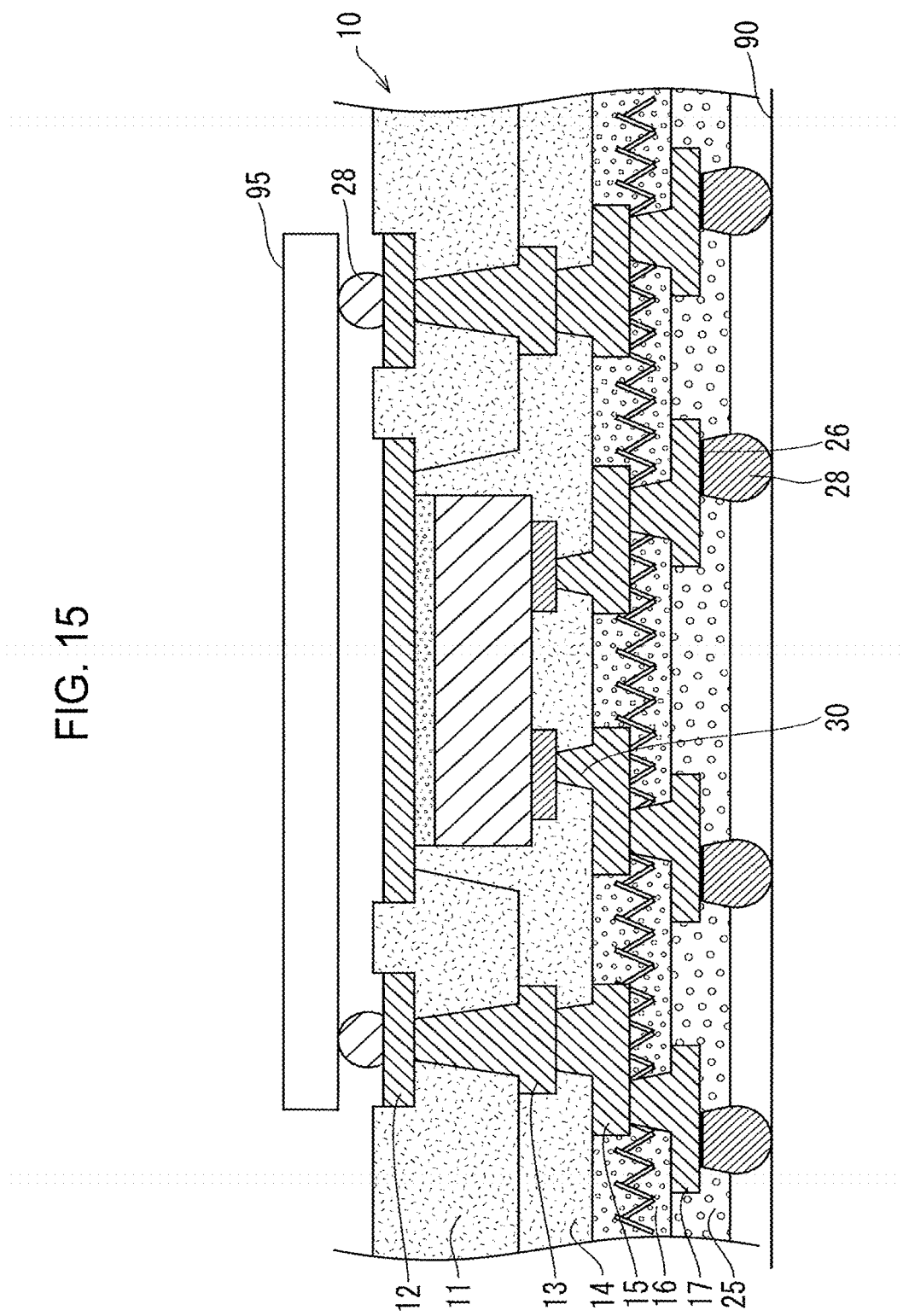
FIG. 15 is a cross-sectional side view illustrating a state in which the wiring substrate is used.
Figure 16:
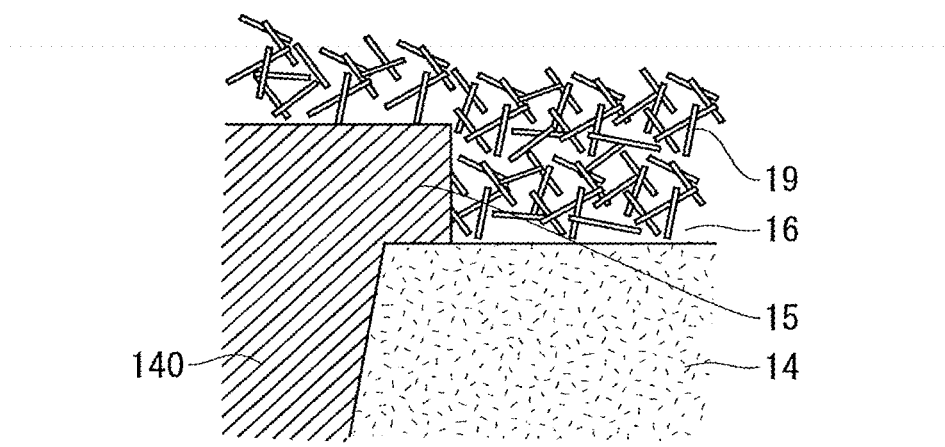
FIG. 16 is an enlarged cross-sectional side view of the wiring substrate.

The description about the structure and the manufacturing method of the wiring substrate 10 of the present embodiment is as given above. Next, an example of use and an operation effect of the wiring substrate 10 are described. For example, as illustrated in FIG. 15, the wiring substrate 10 of the present embodiment is used by connecting the fourth conductive layer 17 side to a motherboard 90 and mounting an electronic component 95 such as a CPU to the first conductive layer 12 side. Specifically, solder bumps 28 are formed on the pads 26. In a state in which the solder bumps 28 face the motherboard 90, the wiring substrate 10 is place on the motherboard 90. Further, solder bumps 28 are also formed on lower surfaces of some of the conductive paths of the first conductive layer 12, and the electronic component 95 is mounted on the solder bumps 28.

However, in the wiring substrate 10 of the present embodiment, the multiple insulating resin layers (11, 14, 16) include one insulating layer (the third insulating resin layer 16) that is formed by a resin sheet containing a reinforcing material 19. Therefore, as compared to a case where all insulating resin layers are each formed by a resin sheet that does not contain a reinforcing material 19, strength can be improved.

Here, it is also conceivable to allow all insulating resin layers to be each formed from a resin sheet containing a reinforcing material 19. However, in a resin sheet containing a reinforcing material 19, it is difficult to reduce a diameter of a via conductor as compared to a resin sheet without a reinforcing material 19, and thus it is likely to be difficult to font' a dense (fine) wiring pattern. Along with this, when all the insulating resin layers are each formed from a resin sheet containing a reinforcing material 19, a problem can occur that the thickness of the wiring substrate is increased.

In contrast, in the wiring substrate 10 of the present embodiment, among the multiple insulating resin layers (11, 14, 16), only the third insulating resin layer 16 contains the reinforcing material 19. Therefore, the strength can be improved, and an increase in diameter of the via conductors and a decrease in density of the wiring pattern can be minimized.

In addition, the third insulating resin layer 16 that is formed on the motherboard 90 side is selected as the insulating resin layer containing the reinforcing material 19. Therefore, a wiring pattern on the electronic component 95 side that is desired to be denser can be easily formed denser than a wiring pattern on the motherboard 90 side.

Further, in the wiring substrate 10 of the present embodiment, the first conductive layer 12 is embedded in the first insulating resin layer 11. Therefore, as compared to a case where the first conductive layer 12 is formed on the secondary surface (11B) of the first insulating resin layer 11, the total thickness of the wiring substrate 10 can be reduced. Further, the lower surface of the first conductive layer 12 is positioned on an inner side of the secondary surface (11B) of the first insulating resin layer 11. Therefore, unnecessary contact between the first conductive layer 12 and the electronic component 95 can be suppressed.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

In the above embodiment, one semiconductor element 30 is accommodated in one cavity 20. However, it is also possible that multiple semiconductor elements 30 are accommodated in one cavity 20.

In the above embodiment, the first insulating resin layer 11 has a thickness greater than thicknesses of the second and third insulating resin layers (14, 16). However, it is also possible that the first insulating resin layer 11 has a thickness smaller than thicknesses of the second and third insulating resin layers (14, 16), or equal to thicknesses of the second and third insulating resin layers (14, 16).

In the above embodiment, the wiring substrate is used by connecting the fourth conductive layer 17 side to the motherboard 90 and mounting the electronic component 95 such as a CPU on the first conductive layer 12 side. However, it is also possible that the positions of the motherboard 90 and the electronic component 95 are reversed.

In the above embodiment, the copper plating layer 37 that becomes the first conductive layer 12 is formed after the Ni plating layer 36 is formed on the carrier 34. However, it is also possible that the copper plating layer 37 that becomes the first conductive layer 12 is directly formed on the carrier 34.

In the above embodiment, three insulating resin layers are provided. However, it is also possible that two insulating resin layers are provided, or four or more insulating resin layers are provided.

In the above embodiment, the first conductive layer 12 is embedded in the first insulating resin layer 11. However, it is also possible that the first conductive layer 12 is laminated on the first insulating resin layer 11.

Figure 17:
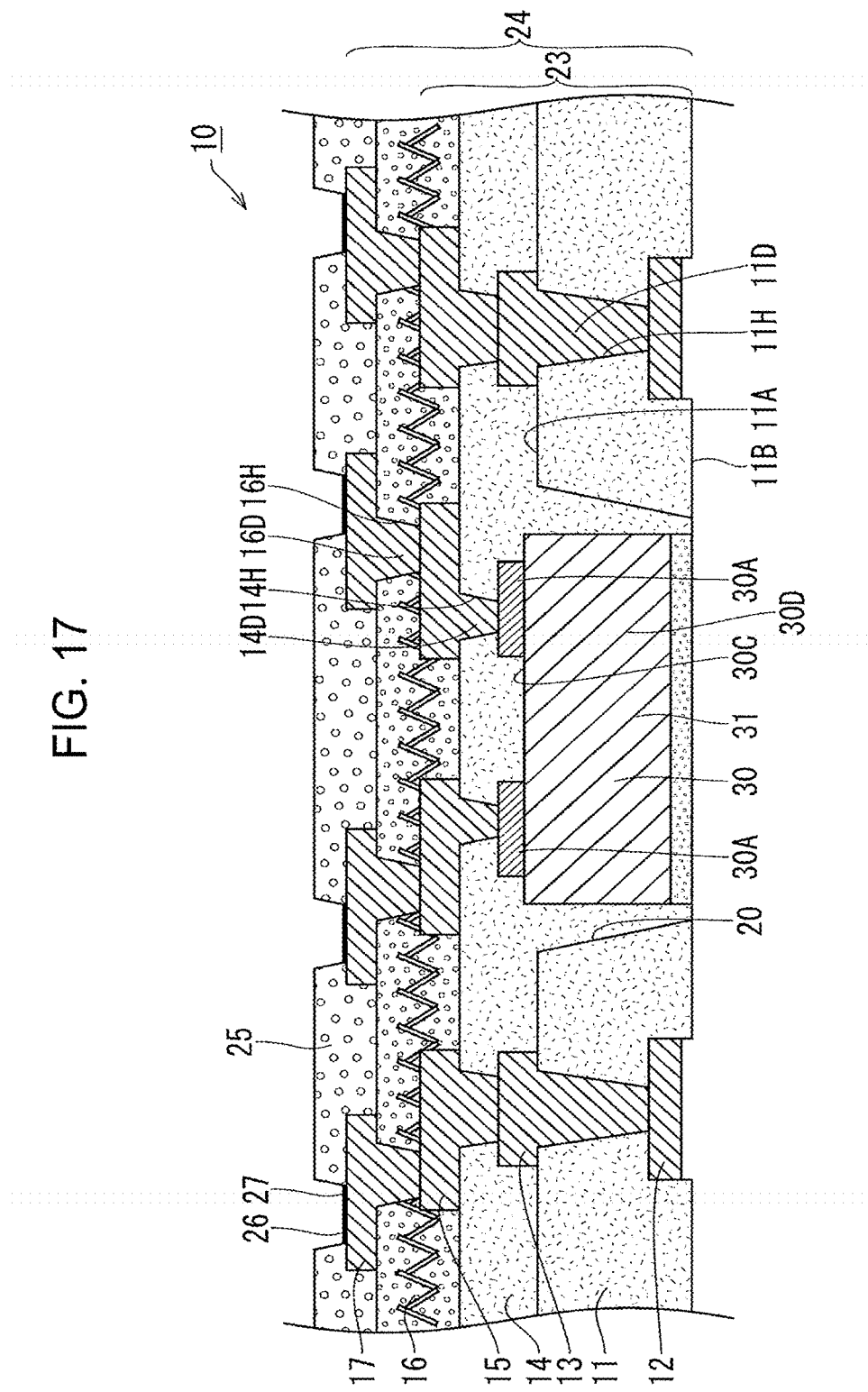
FIG. 17 is a cross-sectional side view of a wiring substrate according to a modified embodiment.

In the above embodiment, the plane portion 18 to which the semiconductor element 30 is bonded is provided in the first conductive layer 12. However, as illustrated in FIG. 17, it is also possible that the plane portion 18 is not provided and the adhesive 31 under the semiconductor element 30 is exposed.

The "fibrous or cloth-like reinforcing material" may be a glass cloth, or a carbon fiber, a glass non-woven fabric, an aramid cloth, an aramid non-woven fabric, or the like, or a combination of these.

Figure 18:
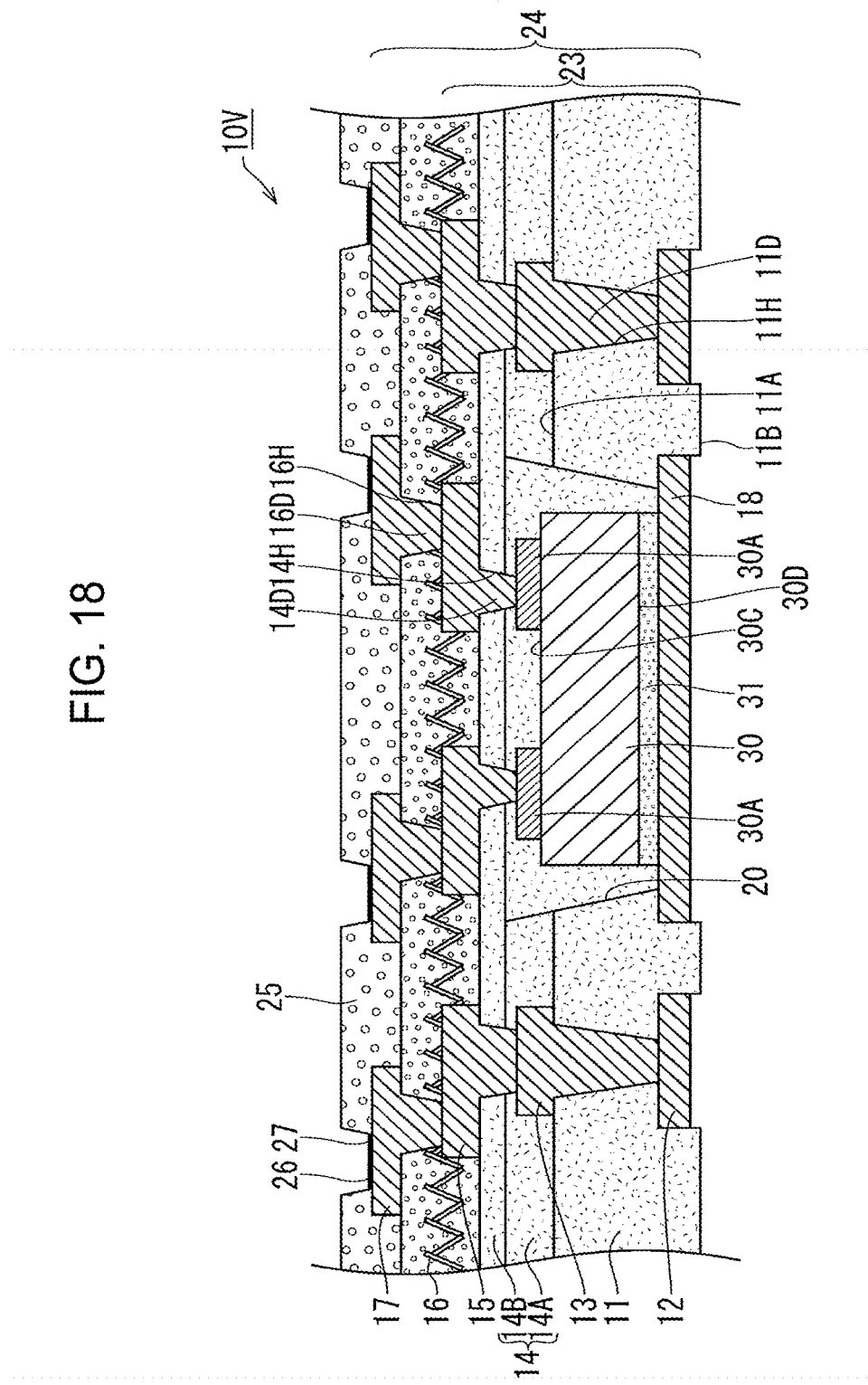
FIG. 18 is a cross-sectional side view of a wiring substrate according to another modified embodiment.

In the above embodiment, the second insulating resin layer 14 has a single-layer structure. However, as illustrated in FIG. 18, it is also possible that the second insulating resin layer 14 has a two-layer structure including a first layer (14A) and a second layer (14B). In this case, the cavity 20 is formed to penetrate both the first insulating resin layer 11 and the first layer (14A) of the second insulating resin layer 14, and the second layer (14B) of the second insulating resin layer 14 enters the cavity 20 and covers the semiconductor element 30. Thereby, after the cavity 20 is formed, when resin residues on the plane portion 18 are removed, that a part of the second conductive layer 13 is erroneously removed can be prevented.

A wiring substrate according to an embodiment of the present invention is formed by laminating multiple conductive layers and multiple insulating layers, the conductive layers each including a conductive path and being insulated from each other by the insulating layers. The wiring substrate includes: a first insulating layer that is formed at one end in a lamination direction among the multiple insulating layers an accommodating part that penetrates the first insulating layer; a semiconductor element that is accommodated in the accommodating part; an outermost conductive layer that is formed at an end on an opposite side of the one end in the lamination direction among the multiple conductive layers, and has multiple pads; and an outermost insulating layer that is formed at an end on an opposite side of the first insulating layer among the multiple insulating layers and contains a fibrous or cloth-like reinforcing material, the outermost conductive layer being laminated on a surface of the outermost insulating layer on an opposite side of the one end in the lamination direction. Among the multiple insulating layers, except the outermost insulating layer, all other insulating layers do not contain the fibrous or cloth-like reinforcing material.

Obviously, numerous modifications and variations of the present invention are possible in light of the above teachings. It is therefore to be understood that within the scope of the appended claims, the invention may be practiced otherwise than as specifically described herein.

The invention claimed is:
1. A wiring substrate, comprising:
a plurality of insulating layers including a first insulating layer and an outermost insulating layer such that the first insulating layer is positioned at one end of the plurality of insulating layers in a lamination direction and that the outermost insulating layer is positioned at an opposite end of the plurality of insulating layers in the lamination direction and comprises a reinforcing material;

a plurality of conductive layers laminated on the insulating layers such that the plurality of conductive layers includes an outermost conductive layer formed on the outermost insulating layer and comprising a plurality of pads, a first conductive layer formed on one end side of the first insulating layer, and a second conductive layer formed on an opposite side of the first insulating layer with respect to the one end side in the lamination direction;

a semiconductor element accommodated in the first insulating layer such that the first insulating layer has an accommodating portion penetrating through the first insulating layer and that the semiconductor element is positioned in the accommodating portion of the first insulating layer; and a plurality of via conductors formed in the first insulating layer such that the plurality of via conductors is penetrating through the first insulating layer and connecting the first conductive layer and the second conductive layer, wherein the plurality of insulating layers is formed such that the insulating layers do not contain a reinforcing material other than the outermost insulating layer.

2. A wiring substrate according to claim 1, wherein the plurality of insulating layers includes a second insulating layer laminated on the first insulating layer such that the second insulating layer is covering the second conductive layer and the semiconductor element and filling a gap formed between the first insulating layer and the semiconductor element in the accommodating portion.

3. A wiring substrate according to claim 2, wherein the semiconductor element has a non-active surface on the one end side of the first insulating layer and an active surface on the opposite side of the first insulating layer with respect to the one end side in the lamination direction such that the active surface has a terminal structure and the non-active surface has no terminal structure, and the first conductive layer has a plane portion partially exposed in the accommodating portion of the first insulating layer and bonded to the non-active surface of the semiconductor element in the accommodating portion of the first insulating layer.

4. A wiring substrate according to claim 2, wherein the outermost insulating layer is formed such that the reinforcing material comprises at least one of a glass cloth, a carbon fiber, a glass non-woven fabric, an aramid cloth and an aramid non-woven fabric.

5. A wiring substrate according to claim 2, further comprising:

a plurality of second via conductors formed in the second insulating layer such that the plurality of second via conductors is connecting a plurality of terminals in the semiconductor element and a third conductive layer of the conductive layers, wherein the plurality of conductive layers includes the third conductive layer formed on the second insulating layer, and the second insulating layer is formed such that the second insulating layer has a two-layer structure comprising a first layer and a second layer formed on the first layer.

6. A wiring substrate according to claim 1, wherein the plurality of conductive layers is formed such that the first conductive layer is embedded in the first insulating layer and has an exposed surface on the one end side of the first insulating layer.

7. A wiring substrate according to claim 6, wherein the first conductive layer is embedded in the first insulating layer such that the exposed surface of the first conductive layer is recessed inward with respect to a surface of the first insulating layer on the one end side of the first insulating layer.

8. A wiring substrate according to claim 7, wherein the semiconductor element has a non-active surface on the one end side of the first insulating layer and an active surface on the opposite side of the first insulating layer with respect to the one end side in the lamination direction such that the active surface has a terminal structure and the non-active surface has no terminal structure, and the first conductive layer has a plane portion partially exposed in the accommodating portion of the first insulating layer and bonded to the non-active surface of the semiconductor element in the accommodating portion of the first insulating layer.

9. A wiring substrate according to claim 7, wherein the outermost insulating layer is formed such that the reinforcing material comprises at least one of a glass cloth, a carbon fiber, a glass non-woven fabric, an aramid cloth and an aramid non-woven fabric.

10. A wiring substrate according to claim 6, wherein the semiconductor element has a non-active surface on the one end side of the first insulating layer and an active surface on the opposite side of the first insulating layer with respect to the one end side in the lamination direction such that the active surface has a terminal structure and the non-active surface has no terminal structure, and the first conductive layer has a plane portion partially exposed in the accommodating portion of the first insulating layer and bonded to the non-active surface of the semiconductor element in the accommodating portion of the first insulating layer.

11. A wiring substrate according to claim 6, wherein the outermost insulating layer is formed such that the reinforcing material comprises at least one of a glass cloth, a carbon fiber, a glass non-woven fabric, an aramid cloth and an aramid non-woven fabric.

12. A wiring substrate according to claim 1, wherein the outermost insulating layer is formed such that the reinforcing material comprises at least one of a glass cloth, a carbon fiber, a glass non-woven fabric, an aramid cloth and an aramid non-woven fabric.

13. A method for manufacturing a wiring substrate, comprising:

forming, on a support member, a plurality of insulating layers including a first insulating layer and an outermost insulating layer such that the first insulating layer is positioned at one end of the plurality of insulating layers in a lamination direction and that the outermost insulating layer is positioned at an opposite end of the plurality of insulating layers in the lamination direction and comprises a reinforcing material, a plurality of conductive layers laminated on the insulating layers such that the plurality of conductive layers includes an outermost conductive layer formed on the outermost insulating layer and comprising a plurality of pads, a first conductive layer formed on one end side of the first insulating layer, and a second conductive layer formed on an opposite side of the first insulating layer with respect to the one end side in the lamination direction, and forming a plurality of via conductors in the first insulating layer such that the plurality of via conductors is penetrating through the first insulating layer and connecting the first conductive layer and the second conductive layer; and removing the support member from the insulating and conductive layers, wherein the forming of the insulating and conductive layers comprises forming the first conductive layer on the support member, forming an accommodating portion in the first insulating layer such that the accommodating portion penetrates through the first insulating layer, accommodating a semiconductor element in the accommodating portion of the first insulating layer such that the semiconductor element is positioned in the accommodating portion of the first insulating layer, forming the outermost insulating layer at the opposite end of the plurality of insulating layers in the lamination direction, and forming the outermost conductive layer on the outermost insulating layer such that the outermost conductive layer comprises the plurality of pads, the removing of the support member comprises removing the support member from the first insulating layer such that the semiconductor element is accommodated in the accommodating portion of the first insulating layer before the support member is removed from the first insulating layer, and the plurality of insulating layers is formed such that the insulating layers do not contain a reinforcing material other than the outermost insulating layer.

14. A method for manufacturing a wiring substrate according to claim 13, wherein the forming of the insulating layers and conductive layers comprises forming the first conductive layer on the support member such that the first conductive layer is formed on one end side of the first insulating layer in the lamination direction, forming the second conductive layer formed on the opposite side of the first insulating layer with respect to the one end side in the lamination direction, and forming a second insulating layer laminated on the first insulating layer such that the second insulating layer covers the second conductive layer and the semiconductor element and fills a gap formed between the first insulating layer and the semiconductor element in the accommodating portion.

15. A method for manufacturing a wiring substrate according to claim 14, wherein the forming of the first insulating layer on the support member comprises covering the first conductive layer on the support member such that the first conductive layer on the support member is embedded in the first insulating layer.

16. A method for manufacturing a wiring substrate according to claim 14, wherein the semiconductor element has a non-active surface on the one end side of the first insulating layer and an active surface on the opposite side of the first insulating layer with respect to the one end side in the lamination direction such that the active surface has a terminal structure and the non-active surface has no terminal structure, the forming of the accommodating portion comprises forming a plane portion of the first conductive layer such that the plane portion is partially exposed in the accommodating portion of the first insulating layer, and the accommodating of the semiconductor element in the accommodating portion of the first insulating layer comprises bonding the non-active surface of the semiconductor element to the plane portion of the first conductive layer partially exposed in the accommodating portion of the first insulating layer.

17. A method for manufacturing a wiring substrate according to claim 14, wherein the support member has a metal film, and the removing of the support member from the first insulating layer comprises removing the support member from the first insulating layer such that the metal film is removed from the support member and that the metal film is etched from the first insulating layer.

18. A method for manufacturing a wiring substrate according to claim 13, wherein the support member has a metal film, and the removing of the support member from the first insulating layer comprises removing the support member from the first insulating layer such that the metal film is removed from the support member and that the metal film is etched from the first insulating layer.

19. A method for manufacturing a wiring substrate according to claim 18, wherein the support member has a second metal film formed on the metal film such that the second metal film comprises a metal material different from the metal film and the first conductive layer and is formed on part of the metal film on which the first conductive layer is to be formed, and the removing of the support member from the first insulating layer comprises removing the support member from the first insulating layer such that the second metal film is etched from the first conductive layer after the metal film is etched from the first insulating layer.

20. A method for manufacturing a wiring substrate according to claim 13, wherein the outermost insulating layer is formed such that the reinforcing material comprises at least one of a glass cloth, a carbon fiber, a glass non-woven fabric, an aramid cloth and an aramid non-woven fabric.

* * * * *